United States Patent
Halabi et al.

(10) Patent No.: US 8,169,833 B2
(45) Date of Patent: May 1, 2012

(54) PARTITIONING PROCESS TO IMPROVE MEMORY CELL RETENTION

(75) Inventors: Shaul Halabi, Mevaseret Zion (IL); Yaniv Sasson, Ramot (IL); Nuriel Amir, Doar Na Shikmim (IL)

(73) Assignee: Micron Technology, Inc., Boise, ID (US)

( * ) Notice: Subject to any disclaimer, the term of this patent is extended or adjusted under 35 U.S.C. 154(b) by 398 days.

(21) Appl. No.: 12/572,182

(22) Filed: Oct. 1, 2009

(65) Prior Publication Data

US 2011/0082964 A1 Apr. 7, 2011

(51) Int. Cl.
*G11C 11/34* (2006.01)
(52) U.S. Cl. ............ 365/185.24; 365/185.11; 365/227
(58) Field of Classification Search ............ 365/185.24
See application file for complete search history.

(56) References Cited

U.S. PATENT DOCUMENTS

| | | | |
|---|---|---|---|
| 5,109,357 A * | 4/1992 | Eaton, Jr. ................. | 365/145 |
| 5,905,675 A * | 5/1999 | Madurawe et al. ...... | 365/185.18 |
| 6,496,417 B1 | 12/2002 | Shiau et al. | |
| 6,563,745 B1 | 5/2003 | Ilkbahar | |
| 6,795,348 B2 * | 9/2004 | Mihnea et al. ........... | 365/185.29 |
| 6,920,060 B2 * | 7/2005 | Chow et al. .................. | 365/145 |
| 7,552,272 B2 | 6/2009 | Gonzalez et al. | |
| 7,561,466 B2 | 7/2009 | Roohparvar | |
| 7,940,568 B1 | 5/2011 | Chiavarone | |
| 8,036,016 B2 | 10/2011 | Sarker et al. | |
| 2004/0160839 A1 | 8/2004 | Kim | |
| 2004/0264264 A1 | 12/2004 | Yaegashi et al. | |
| 2005/0167734 A1 * | 8/2005 | She et al. ...................... | 257/321 |
| 2006/0050576 A1 | 3/2006 | Kim | |
| 2006/0140009 A1 | 6/2006 | Lojek | |
| 2008/0155301 A1 | 6/2008 | Ahvenainen et al. | |
| 2009/0168504 A1 | 7/2009 | Lee et al. | |
| 2009/0201721 A1 | 8/2009 | Ha et al. | |
| 2011/0249501 A1 * | 10/2011 | Chiavarone et al. ..... | 365/185.11 |

OTHER PUBLICATIONS

Ielmini et al., "A New Charge-Trapping Technique to Extract SILC-Trap Time Constants in $SiO_2$", IEDM Tech. Dig., S22.2, 4 pages, 2005.

* cited by examiner

*Primary Examiner* — Alexander Sofocleous
(74) *Attorney, Agent, or Firm* — Berkeley Law & Technology Group, LLP

(57) ABSTRACT

Subject matter disclosed herein relates to improving memory cell retention for non-volatile flash memory.

18 Claims, 4 Drawing Sheets

PARTITIONING PROCESS TO IMPROVE MEMORY CELL RETENTION

BACKGROUND

1. Field

Subject matter disclosed herein relates to improving memory cell retention for non-volatile flash memory.

2. Information

Flash memories typically preserve stored information even in power-off conditions. In such memories, in order to change a logic state of a cell, e.g. a bit, an electric charge present in a floating gate of the cell may be changed by application of electric potentials to various portions of the cell. A "0" state typically corresponds to a negatively charged floating gate and a "1" state typically corresponds to a positively charged floating gate. As intended, a non-volatile memory may preserve stored information over time, but a reliability of such a memory may be limited by degenerative processes affecting a tunnel oxide of the memory during various programming and erasing cycles. As a cell is programmed and erased, electrons move to and from the floating gate through the tunnel oxide. Such electrons may create "traps" in the oxide (i.e., defects in the oxide in which electrons may be trapped). Trap density may increase with the number of program and erase cycles experienced by the tunnel oxide. Due to the presence of these traps, a programmed or erased floating gate may show an enhanced charge loss and/or charge gain even under relatively low electric fields across the tunnel oxide commonly seen during normal conditions of storage and reading of the cell. Such low level charge loss and/or charge gain mechanisms, which may lead to information loss, are undesirable since flash memory devices are expected to be able to store information on the order of at least several years.

A current loss, depending on its direction, may either lead to a charge gain or a charge loss. A charge gain may correspond to information loss for a "1" state, whereas a charge loss may correspond to information loss for a "0" state. In either case, such a logic state determined by charge on a floating gate may be lost, possibly leading to a memory failure.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
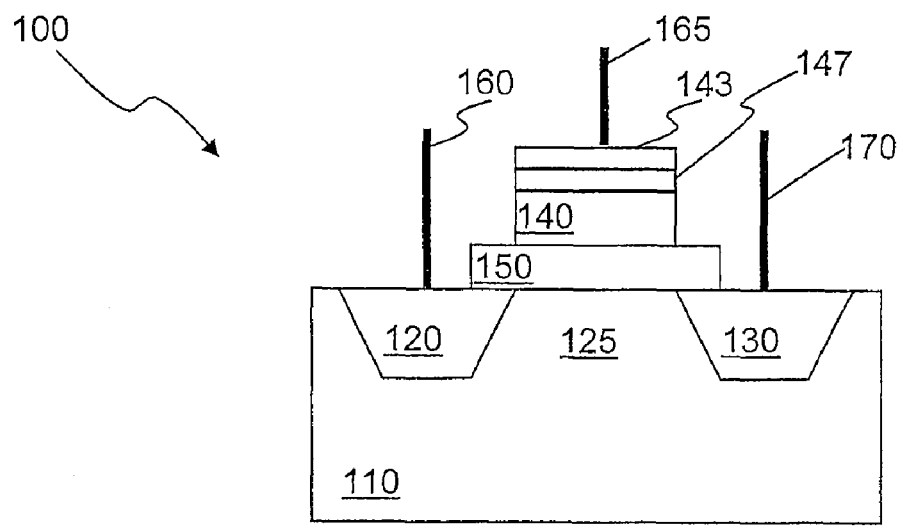
FIG. 1 is a schematic view of memory cell, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory cell, which may be in a "1" state or a "0" state, may comprise a portion of a non-volatile memory device. Herein, memory device may include a discrete integrated circuit component and/or multiple addressable memory dies, just to name a few examples. Such memory devices may be partitioned into two or more memory portions. Subsequently, one or more such memory portions may be operated in a standby mode while other such memory portions may be concurrently operated in a read/write mode. In one implementation, a relatively small portion of a memory device may be operated in a standby mode compared to other portions of the memory device that may be concurrently operated in a read/write mode. Memory portions operated in a standby mode may be subjected to an applied healing polarization to redistribute electrical oxide charges in an oxide region of the memory portions in standby mode. For example, such a healing polarization applied to memory cells of an erased portion of a memory device may induce migration of oxide charges away from a silicon interface of the memory cells. Such migration may lead to reduction of tunneling to the silicon interface, resulting in a reduction of undesirable shifts in threshold voltages of the memory cells.

In a particular implementation, such a healing polarization may include a constant bias electric field applied to a memory cell for a relatively long period, or an electric field having an alternating polarization, as explained in detail below. In such cases, magnitude of an electric field associated with a healing polarization may be maintained below a relatively low voltage, as described below, otherwise such a healing polarization may undesirably trigger a process of charges tunneling from a silicon region to an oxide region of a memory cell. In order to compensate for a healing polarization applied at such a relatively low voltage, healing polarization may be applied for a relatively long time as compared to times involved with program/erase operations of the memory cell. Though a healing polarization may enhance data retention performance, relatively long times associated with such a healing polarization may reduce speed performance of a memory device. Thus, a healing polarization may be applied to merely a portion of a memory device while a remaining portion of the memory device may continue to operate in a program/erase mode, as described in detail below.

FIG. 1 is a schematic view of a memory cell 100, according to an embodiment. Such a memory cell may comprise a body or substrate 110, such as silicon, that includes doped regions 120, 125, and 130. For example, doped regions 120 and 130 may comprise source/drain n-doped regions, whereas intervening region 125 may comprise a p-doped channel region. In a particular implementation, doped region 130 may comprise a drain region so that line 170 may act as a bitline to the memory cell, and line 160 may act as a source line. Line 165 may comprise a wordline, for example, to apply voltage or other electrical signal to a floating gate 140. An oxide layer 147 may be disposed between floating gate 140 and a top (control) gate 143. Line 165 may be electrically coupled to top gate 143. An oxide layer 150 may be disposed between floating gate 140 and channel region 125. Of course details of such a memory cell are merely examples, and claimed subject matter is not so limited.

Figure 2:
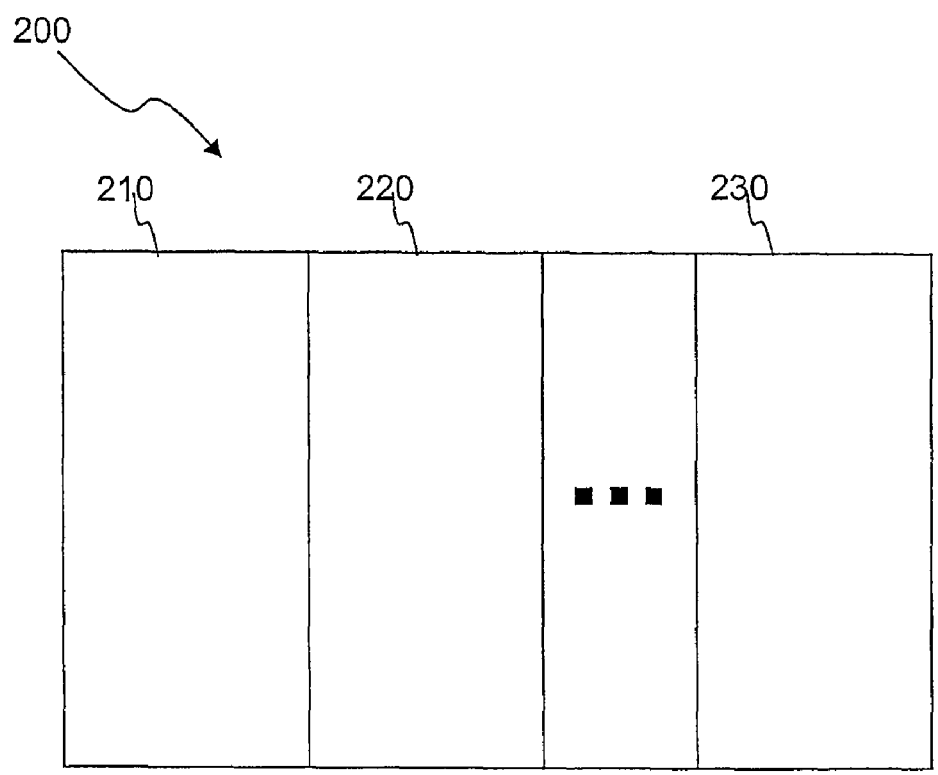
FIG. 2 is a schematic view of memory partitions, according to an embodiment.

FIG. 2 is a schematic view of memory partitions, according to an embodiment. A memory device 200 may be partitioned into partitions 210, 220, 230, though such a quantity and/or sizes of partitions are merely examples, and claimed subject matter is not so limited. A memory controller and/or special purpose processor (shown in FIG. 5) may carry out such partitioning, for example, though claimed subject matter is not so limited. In a particular embodiment, after a period of operating a memory device in a program/erase mode, one or more partitions, such as partition 210, may be selected for a healing polarization process. Such a process may comprise applying a healing polarization to one or more memory cells of partition 210 in order to reduce undesirable oxide charging resulting from an earlier program/erase mode of operation. In one particular implementation, a healing polarization process may be applied to one partition 210 while one or more other partitions 220 and/or 230 are concurrently operating in a program/erase mode. Thereafter, for example, a healing polarization process may be sequentially applied to another partition 220 while other partitions 210 and/or 230 are returned and/or remain in a program/erase mode. Selecting portions and/or partitions to be subjected to a healing polarization process may be performed in a predetermined sequence. Alternatively, such selecting may be based, at least in part, on frequency and/or quantity of use of a particular portion and/or partition, since greater use of a memory (operating in program/erase mode) may lead to increased oxide charging. In another alternative implementation, such selecting may be based, at least in part, on detecting errors and/or a measured bit error rate (BER) of a particular portion and/or partition of memory, since errors may be indicative of a presence of oxide charging that may lead to erroneously switched memory states.

Figure 3:
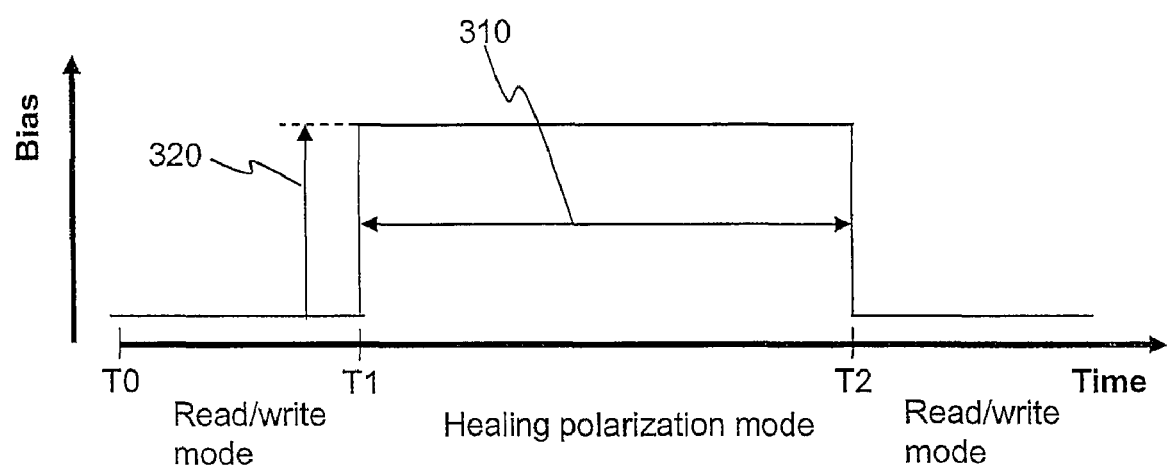
FIG. 3 is a timing diagram for a memory partition subjected to healing polarization, according to an embodiment.

FIG. 3 is a timing diagram for a memory partition subjected to healing polarization, according to an embodiment. At time T0, such a memory partition may be operated in a read/write mode. At time T1, the memory partition may be operated in a standby mode and subjected to a healing polarization by applying a bias electric field to memory cells of the memory partition. For example, a constant or pulsed electric field may be applied between a control gate and a substrate of a memory cell. In a particular implementation, such an electric field may be applied to a control gate of a memory cell. A memory partition may comprise one or more blocks of memory cells, wherein a block may include 0.5 to 1.0 million memory cells, for example, though claimed subject matter is not so limited. In one implementation, a magnitude 320 of such a bias electric field may be constant, as indicated in FIG. 3. In other implementations, magnitude 320 may vary as a square-wave, a sinusoidal wave, a triangular wave, and a saw-tooth wave, just to name a few examples. In such cases of alternating bias electric fields, parameters of a particular memory cell may determine, at least in part, values for alternating frequency and magnitude applied to a memory cell. Such parameters may include a thickness of oxide 150 (FIG. 1) and other dimensions and/or materials of a memory cell, and number of program/erase cycles between healing. In other words, for a given set of memory cell usage conditions and memory cell parameters, healing polarization magnitude, shape, and/or length may be selected to optimize healing.

A time span 310 of a healing polarization mode may be several orders of magnitude greater than read/write process times. For example, time span 310 may comprise a period in the order of seconds (e.g., greater than one second), while read/write process times may comprise periods in the order of microseconds. Of course such times are merely examples, and claimed subject matter is not so limited. In a particular implementation, magnitude 320 may include bias voltages in the order of approximately 1.0 to 10.0 volts. Of course such voltages are merely examples, and magnitude 320 may include other values as well. Accordingly, claimed subject matter is not limited to voltages mentioned in these examples. After such a healing polarization mode, at time T2, a memory partition may return from a standby mode to a read/write mode.

Figure 4:
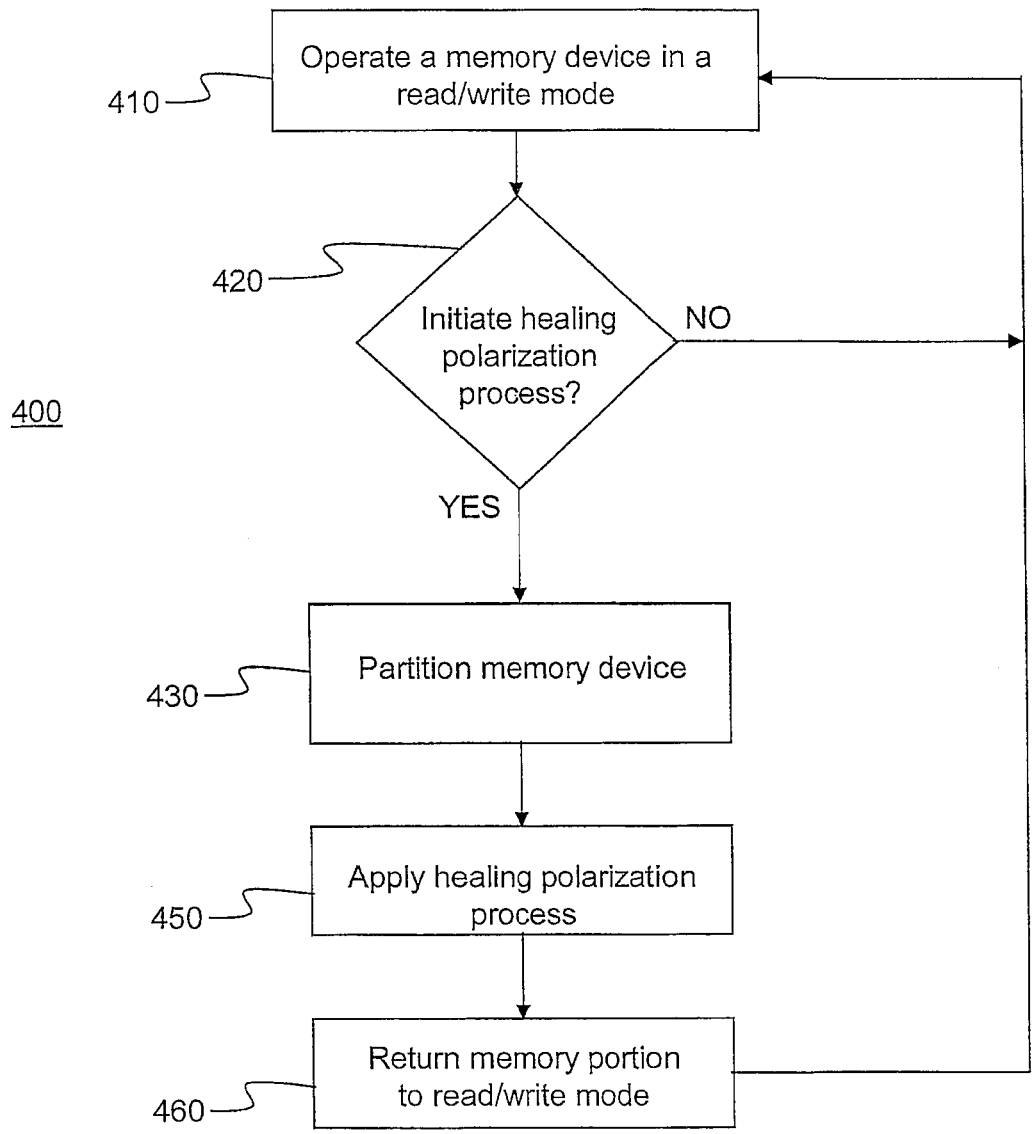
FIG. 4 is a flow diagram of a healing polarization process, according to an embodiment.

FIG. 4 is a flow diagram of a process 400 to reduce charge loss for memory cells included in a memory device, according to an embodiment. Such as memory cell may comprise memory cell 100 shown in FIG. 1, for example. Process 400 may be applied to at least a portion of a memory device. At block 410, such a memory device may be operated in a read/write mode during which cycling memory cells among different states (e.g., binary states) of such a memory device may lead to oxide charging. As discussed above, such oxide charging may correspond to charge tunneling to a silicon interface, resulting in undesirable shifts in threshold voltages of memory cells. Such shifts may lead to memory failure. Accordingly, at block 420, a healing polarization process may be initiated as a preventive measure before such memory failures occur. As discussed above, initiating a healing polarization process may be based, at least in part, on a predetermined time schedule, frequency, and/or quantity of use, and/or detecting errors and/or a measured bit error rate (BER) of a particular portion and/or partition of a memory device. If a determination is made not to initiate a maintenance process, then process 400 may return to block 410 where a memory device may continue to operate in a read/write mode. On the other hand, if a determination is made to initiate a healing polarization process, then process 400 may proceed to block 430 where a memory device may be partitioned into one or more portions. In such a case, a healing polarization process may be applied to one portion of memory operating in a standby mode while another portion of memory continues to operate in a read/write mode.

At block 450, a healing polarization process may be applied to a portion of memory. In particular, a healing polarization, such as that shown in FIG. 3, may be applied to one or more memory cells of a portion of memory. At block 460, after being subject to a healing polarization process, a portion of memory may be returned to a read/write mode of operation. Subsequently, process 400 may return to block 410 to repeat. Of course, details of such a healing polarization process are merely examples, and claimed subject matter is not so limited.

Figure 5:
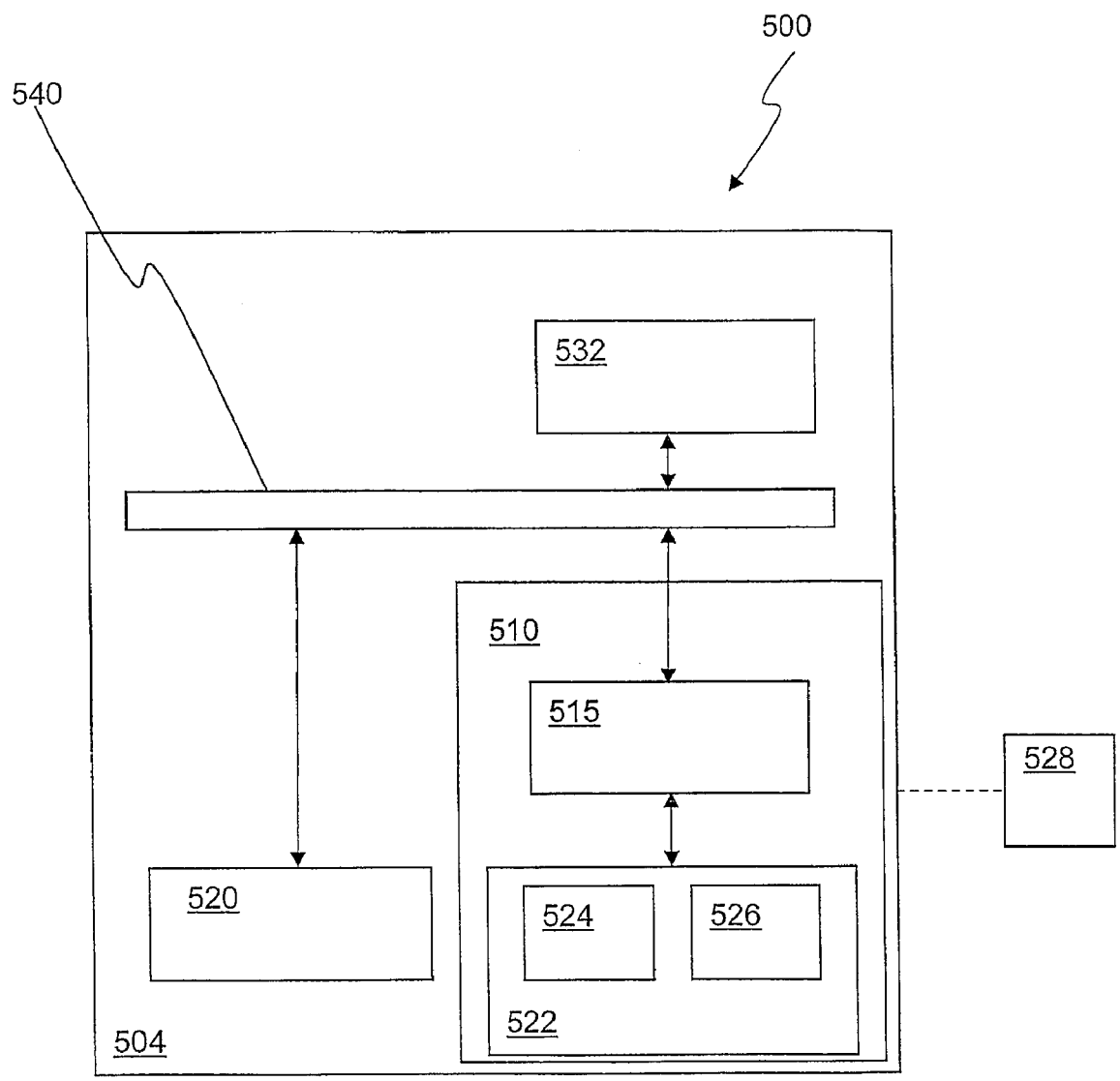
FIG. 5 is a schematic diagram illustrating an exemplary embodiment of a computing system.

FIG. 5 is a schematic diagram illustrating an exemplary embodiment of a computing system 500 including a memory device 510, to which one or more healing polarization processes may be applied, as described above for example. A computing device 504 may be representative of any device, appliance, and/or machine that may be configurable to manage memory device 510. Memory device 510 may include a memory controller 515 and a memory 522, which may comprise flash memory to which such a healing polarization may be applied. In such a case, memory controller 515 may provide instructions and/or signals to initiate a healing polarization process.

By way of example but not limitation, computing device 504 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 500, and the processes and methods as further described herein, may be implemented using or otherwise including hardware, firmware, software, or any combination thereof. Thus, by way of example but not limitation, computing device 504 may include at least one processing unit 520 that is operatively coupled to memory 522 through a bus 540 and a host or memory controller 515. Processing unit 520 is representative of one or more circuits configurable to perform at least a portion of a data computing procedure or process, such as a maintenance process described above, for example. By way of example but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may communicate with memory controller 515 to process memory-related operations, such as read, write, and/or erase, as well as memory partition processes discussed above, for example. Processing unit 520 may include an operating system configured to communicate with memory controller 515. Such an operating system may, for example, generate commands to be sent to memory controller 515 over bus 540. Such commands may include instructions to initiate a healing polarization process, for example.

Memory 522 is representative of any data storage mechanism. Memory 522 may include, for example, a primary memory 524 and/or a secondary memory 526. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

Secondary memory 526 may include, for example, the same or similar type of memory as primary memory and/or one or more data storage devices or systems, such as, for example, a disk drive, an optical disc drive, a tape drive, a solid state memory drive, etc. In certain implementations, secondary memory 526 may be operatively receptive of, or otherwise configurable to couple to, a computer-readable medium 528. Computer-readable medium 528 may include, for example, any medium that can carry and/or make accessible data, code, and/or instructions for one or more of the devices in system 500.

In one implementation, processing unit 520 may host one or more applications to initiate commands to memory controller 515 to store information in and/or retrieve information from a memory device. Such applications may comprise word processing applications, voice communication applications, navigation applications, and so on. For example, memory controller 515, responsive to commands initiated from processing unit 520, may apply a memory cell healing polarization process to a portion of a memory device by supplying a portion of the non-volatile memory device with healing polarization according to embodiments described above. Such healing polarization may comprise an electric field having an amplitude and/or a duration based, at least in part, on parameters of the particular memory device to which such a process is applied.

Computing device 504 may include, for example, an input/output 532. Input/output 532 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 532 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Some portions of the detailed description above are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In one example, such a special purpose computer or special purpose electronic computing device may comprise a general purpose computer programmed with instructions to perform one or more specific functions. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
partitioning a non-volatile memory device into a first memory portion and a second memory portion, wherein said first memory portion includes a plurality of memory cells, wherein said plurality of memory cells include tunnel oxide layers;
operating said first memory portion in a standby mode while operating said second memory portion in a read/write mode; and
applying a healing polarization to said first memory portion in said standby mode to redistribute electrical oxide charges in said tunnel oxide layers of said plurality of memory cells of said first memory portion of said non-volatile memory device.

2. The method of claim 1, wherein said healing polarization is applied to said first memory portion for substantially one second or more.

3. The method of claim 1, wherein said first memory portion comprises a block of memory cells of said non-volatile memory device.

4. The method of claim 1, further comprising returning said first memory portion to operate in said read/write mode.

5. The method of claim 4, further comprising:
subsequent to returning said first memory portion to operate in said read/write mode, applying said healing polarization to said second memory portion; and
returning said second memory portion to operate in said read/write mode.

6. The method of claim 1, further comprising:
applying said healing polarization process to said first memory portion in response to detecting one or more bit errors from said first memory portion.

7. The method of claim 1, wherein said applying said healing polarization comprises applying a substantially constant electric field to a control gate of said memory cells of said first memory portion during said standby mode.

8. The method of claim 1, wherein said healing polarization comprises a pulsed polarization to generate a pulsed electric field between a floating gate and a substrate of said memory cells of said first memory portion during said standby mode.

9. A non-volatile memory device comprising:
a memory cell array including a first memory portion and a second memory portion, wherein said first memory portion includes a plurality of memory cells, wherein said plurality of memory cells include tunnel oxide layers; and
a controller adapted to apply a healing polarization to said first memory portion while said first memory portion operates in a standby mode and while said second memory portion operates in a read/write mode, wherein said healing polarization comprises redistributing electrical oxide charges in said tunnel oxide layers of said plurality of memory cells of said first memory portion of said non-volatile memory device.

10. The non-volatile memory device of claim 9, wherein said controller is further adapted to apply said healing polarization to said first memory portion for substantially one second or more.

11. The non-volatile memory device of claim 9, wherein said first memory portion comprises a block of memory cells of said non-volatile memory device.

12. The non-volatile memory device of claim 9, wherein said healing polarization comprises a substantially constant electric field applied to a control gate of said memory cells of said first memory portion during said standby mode.

13. The non-volatile memory device of claim 9, wherein said healing polarization comprises a pulsed polarization to generate a pulsed electric field between a floating gate and a substrate of said memory cells of said first memory portion during said standby mode.

14. A system comprising:
a processor to execute one or more applications stored in a memory cell array of a non-volatile memory device, wherein said memory cell array includes a first memory portion and a second memory portion, wherein said first memory portion includes a plurality of memory cells, wherein said plurality of memory cells include tunnel oxide layers; and
a controller to apply a healing polarization to said first memory portion of said memory cell array while said first memory portion operates in a standby mode and while said second memory portion of said memory cell array operates in a read/write mode, wherein said healing polarization comprises redistributing electrical oxide charges in said tunnel oxide layers of said plurality of memory cells of said first memory portion of said non-volatile memory device.

15. The system of claim 14, wherein said controller is further adapted to apply said healing polarization to said first memory portion for substantially one second or more.

16. The system of claim 14, wherein said first memory portion comprises a block of memory cells of said non-volatile memory device.

17. The system of claim 14, wherein said healing polarization comprises a substantially constant electric field applied to a control gate of said memory cells of said first memory portion during said standby mode.

18. The system of claim 14, wherein said healing polarization comprises a pulsed polarization to generate a pulsed electric field between a floating gate and a substrate of said memory cells of said first memory portion during said standby mode.

* * * * *